United States Patent [19]

Rödhammer et al.

[11] Patent Number: 4,901,338
[45] Date of Patent: Feb. 13, 1990

[54] ROTARY ANODE FOR X-RAY TUBES AND METHOD OF MANUFACTURE

[75] Inventors: Peter Rödhammer, Reutte; Karlheinz Kailer, Breitenwang, both of Austria

[73] Assignee: Schwarzkopf Development Corporation, New York, N.Y.

[21] Appl. No.: 366,239

[22] Filed: Jun. 12, 1989

Related U.S. Application Data

[63] Continuation of Ser. No. 226,760, Aug. 1, 1988, abandoned.

[30] Foreign Application Priority Data

Aug. 3, 1987 [AT] Austria ................................. 1959/87

[51] Int. Cl.⁴ .............................................. H01J 35/10
[52] U.S. Cl. ...................................... 378/144; 378/129

[58] Field of Search ..................... 378/143, 144, 129

[56] References Cited

U.S. PATENT DOCUMENTS 4,335,327 6/1982 Waugh et al. ..................... 378/144
4,516,255 5/1985 Petter et al. ....................... 378/144

Primary Examiner—Craig E. Church
Attorney, Agent, or Firm—Morgan & Finnegan

[57] ABSTRACT

Rotary graphite anode for use in X-ray tubes comprising a basic body consisting of graphite and a high melting alloy and having a tungsten alloy focal track. The basic body is secured to a graphite substrate. The graphite substrate is coated by a layer of carbon formed by decomposition of hydrocarbon gases in an activated d.c. voltage discharge.

23 Claims, 2 Drawing Sheets

ROTARY ANODE FOR X-RAY TUBES AND METHOD OF MANUFACTURE

BACKGROUND OF THE INVENTION

1. Field of the Invention

The invention relates to a rotary anode for X-ray tubes comprised of a dense carbon coating and the method of manufacturing such anodes. Dense-coating of anode surfaces with carbon is achieved by depositing a carbon coating generated by decomposition of hydrocarbon gases at temperatures below the thermal decomposition temperature on rotary anode surfaces.

2. The Prior Art

Modern X-ray diagnostic procedures such as computer tomography require rotary anodes with a very high thermal capacity In addition to having high thermal capacity, these rotary anodes must also be capable of withstanding acceleration to speeds as high as 10,000 r.p.m followed by sudden braking.

Conventional rotary anodes consist of high melting metals such as tungsten, molybdenum or related alloys. Such materials, however, have a very high specific weight, precluding their use in rotary anodes employed in computer tomography where sudden high speed acceleration and braking is required.

Graphite, because of its low specific weight, has been found to be a suitable material for the manufacture of these rotary anodes. Furthermore, graphite has a significantly higher heat capacity and superior thermal emissivity (heat radiation) when compared to metals which melt at high temperatures There are presently two conventional designs for graphite anodes. In one variety, the basic body of the rotary anode is made from graphite provided with a thin target layer of a high melting-temperature metal, such as a tungsten-rhenium alloy in the path of radiation. This target layer is preferably applied by coating methods known in the art such as the CVD-procedure.

In the other conventional rotary graphite anode design, the target layer is made from a high melting temperature metal such as molybdenum or a molybdenum alloy which is joined outside of the target layer with one or more sintered graphite sections, preferably by soldering.

These conventional rotary graphite anodes suffer from the disadvantage that fine graphite particles can become embedded in the porous graphite surface as a result of abrasion. These embedded fine graphite particles cannot be adequately removed by cleaning methods such as ultrasound bath cleaning.

The embedded fine graphite particles also lead to "dusting"; i.e., fine graphite particles become detached from the surface of the graphite by the action of electrostatic forces or by centrifugal forces and deposit within the X-ray tube This may lead to flash-overs in the X-ray tube, Particularly at voltages in excess of 100 kV.

Furthermore, gases which had been absorbed by the graphite due to its high porosity (normally about 20% of the volume) may be released in the vacuum of the X-ray tube, causing a deterioration of the vacuum and, in turn, operating interferences in the form of flashovers.

To avoid "dusting", and the release of gas from rotary graphite anodes graphite surfaces are sealed with coating materials. German published patent disclosure DE-OS 31 34 196 describes the coating of a rotary graphite anode with a coating consisting of pyrolytic carbon formed by decomposing a gaseous hydrocarbon compound at temperatures in the range of 1000° to 1100° C. This coating significantly increases the high-voltage stability; however, the thermal emissivity is significantly impaired compared to rotary anodes with an uncoated graphite surface, as is the ability of the anode to withstand loading.

Another drawback of a pyrolytically applied carbon coating is the fact that a high coating temperature of about 1000° C. or higher is required at pressures ranging from about 10 to about 1000 mbar.

Rotary graphite anodes in which one or more graphite parts are joined with a basic body of high-melting metal by soldering require that the graphite coating be applied prior to joining the parts with the basic body by soldering. At high coating temperatures, hydrogen released in the course of the coating step leads to embrittlement of the solder and, consequently, damages the composite material.

Another more serious drawback of pyrolytically deposited carbon coatings employed with sintered graphite is that the different coefficients of expansion of sintered graphite and pyrolytic carbon coating causes high stress in the coating, which negatively impacts on the resistance of the coating to thermal shock. Adhesive or cohesive failure due to mechanical action occurs in the presence of prestresses in the coating even under lower loads.

SUMMARY AND OBJECTS OF THE INVENTION

It is an object of the present invention to provide a rotary anode suitable for use in X-ray diagnostic procedures.

It is a further object of the present invention to provide a rotary graphite coated anode having a high thermal capacity and capable of withstanding intermittent acceleration to speeds as great as 10,000 r.p.m.

It is a still further object of the present invention to provide a rotary graphite-coated anode suitable for use in applications such as computer tomography which is resistant to dusting and resultant flash-over.

In accordance with the above-sated objectives, a carbon coated rotary anode is provided wherein a rotary anode is carbon-coated by decomposition of hydrocarbon gases, preferably acetylene or propane, in an activated discharge of d.c. voltage.

With this type of deposition, the hydrocarbons are decomposed under the action of energetic particles in a gas discharge at coating temperatures that are well below the temperatures required for thermal dissociation (at least 1000° C.), i.e., at coating temperatures in the range of from about 200° to about 650° C. The gaseous atoms ionized in such discharge are either accelerated against graphite substrates connected to the cathode, or impact against the substrates as neutral particles which become energized upon impact. A dense surface coating which strongly adheres to the anode surface and which is relatively free from dusting and flash-over is thereby achieved.

Carbon coatings of the anode of the present invention are characterized by an extremely fine crystalline structure which is usually amorphous with grain sizes of less than about 0.1 $\mu$m. This crystalline structure has a preferred orientation with the hexagonal prism axis parallel with the direction of growth of the coating. Compared to coatings employed in the present invention, pyrolytically deposited carbon coatings exhibit a lamella-like coarse structure, which in some instances may be granular.

Comparison of X-ray diffraction of conventional carbon coatings and those employed in the present invention further illustrates their differences. Carbon coatings deposited according to the invention show a (002)-x-ray diffraction reflex that is significantly widened to (2 H >0.6° half-value width) as compared to sintered graphite; whereas pyrolytically deposited carbon coatings hardly show any widening.

By the coating method of the invention, the detachment of graphite particles from the surface during operation of the rotary anode is greatly reduced compared to the detachment which occurs in rotary graphite anodes coated with a pyrolytic carbon layer.

The mean value of surface roughness Ra is reduced by the coating method of the invention, but to a much lesser degree than with pyrolytically deposited coatings. The degree of reduction depends on the surface roughness prior to coating. Pores that are open toward the surface and which have diameters of about twice the thickness of the coating, for example, are still sealed.

It is a surprising and unexpected result that rotary anode coatings manufactured in accordance with the present invention exhibit a slight increase in thermal emissivity as compared to uncoated graphite; in contrast with conventional pyrolytic coatings in which emissivity is distinctly reduced.

This surprising effect has been attributed to the higher micro-roughness of the carbon coating deposited according to the invention, as compared to a pyrolytically deposited coating layer.

In a preferred embodiment the thickness of the carbon coating of the invention is in the range of from about 3 $\mu$m to about 7 $\mu$m. Below 3 $\mu$m, the graphite particles do not adequately adhere to the coating and become loosened during pretreatment or because of the local surface geometry. With a coating thickness in excess of 7 $\mu$m, the natural stresses of the carbon coating become significant and, when combined with the thermal stresses that occur during the operation of the rotary anodes, may cause bursting and peeling of the coating.

A standard PVD-coating plant, which is available on the commercial market can be used for depositing the carbon coating according to the invention.

In a particularly preferred embodiment of the present invention, the rate at which the carbon is deposited is increased by evaporating graphite by means of an electron beam gun. In this way, a significantly higher rate of deposition of the carbon coating according to the invention is achieved without adverse effects on the properties of the coating.

DETAILED DESCRIPTION OF A PREFERRED EMBODIMENT

Figure 1:
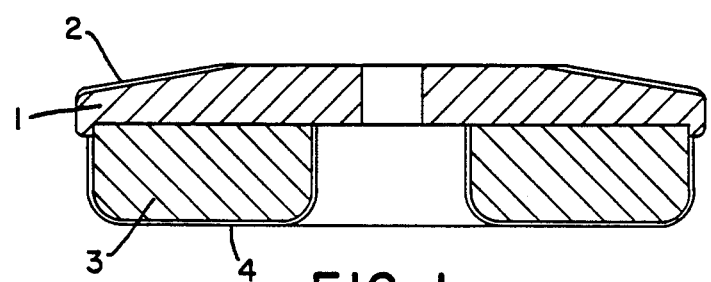
FIG. 1 illustrates a cross-sectional view of a rotary graphite composite anode manufactured according to the invention.

As illustrated in FIG. 1, a rotary graphite composite anode manufactured according to the present invention comprises a basic body 1 made from a high-melting alloy such as the molybdenum alloy TZM, having a radiation path or focal track coating 2 consisting of a tungsten-rhenium alloy, and a graphite part 3, which is attached to the basic body 1 by means such as soldering, and which is provided with a plasmalytically deposited carbon coating 4 applied to its surface. This rotary anode has a heat capacity of about 700 kJ based on a maximum operating temperature of 1200° C.

The rotary anode is coated on a conventional ion Plating-coating machine with two electron guns and an additional auxiliary anode ("triode arrangement").

The graphite composite anode in the finished condition, i.e., soldered condition, was first subjected to precleaning in an ultrasound cleaning bath. Subsequently, the composite anode was subjected to vacuum annealing at 1350° C. for a duration of 5 hours, which effected substantial degassing of the graphite part of the rotary anode. After masking the metallic surfaces, the composite anode was then immediately installed in a coating furnace. This furnace was evacuated by pumping to a pressure of 10 Pa and simultaneously heated by radiation to a temperature of approximately 500° C. The graphite part of the rotary anode was degassed again in the course of this operation. In the next step, the ion etching step, the surface of the graphite part was atomically cleaned for half an hour under an argon atmosphere of 1 Pa and with throttled suction, by applying a d.c. voltage of 5 kV. The rotary anode was simultaneously heated to about 650° C.

Subsequently, the coating process was started by feeding propane into the operating glow discharge, whereby the partial pressure of the propane was increased to about 50 % to 80 of the total pressure of 0.5 to 2 Pa. The glow discharge was maintained in the course of coating by a workpiece voltage of −1000 to −3000 volts. By applying a voltage of +30 to +100 volts to the auxiliary anode, the degree of ionization of the plasma was increased, so that a current density of about 0.1 mA/cm$^2$, was obtained on the surface of the graphite. In addition, two graphite rods, which were arranged in the coating booth, were evaporated by two electron beam guns each having an output of 2 to 4 kW, resulting in a carbon evaporation rate of approximately 2 to 5 g/h. After a coating period of 3 hours, the coating operation was completed.

Finally, the rotary anode was cooled in a vacuum. The carbon coating deposited on the graphite surface of the rotary anode by the procedure of the invention had a layer thickness of 5 $\mu$m.

The rotary graphite composite anode coated according to the invention was compared on a tube test stand with two conventional rotary graphite composite anodes having the same dimensions and material structure to test the anodes for thermal emissivity and resistance to high voltage. One conventional anode had an uncoated graphite part and the other had a pyrolytically coated graphite part.

To determine thermal stressability, the rotary anodes were exposed to a tube voltage of 85 kV and a tube current of 250 mA, with an electron beam gun shot duration of 6.4 seconds.

To avoid exceeding the maximum operating temperature of 1200° C., pauses of 150 second duration were scheduled between the individual exposures of both the rotary anode of the present invention and the conventional uncoated rotary anode. The pause period had to be increased to 190 seconds for the pyrolytically coated rotary anode in order not to exceed the limit temperature.

Figure 2:
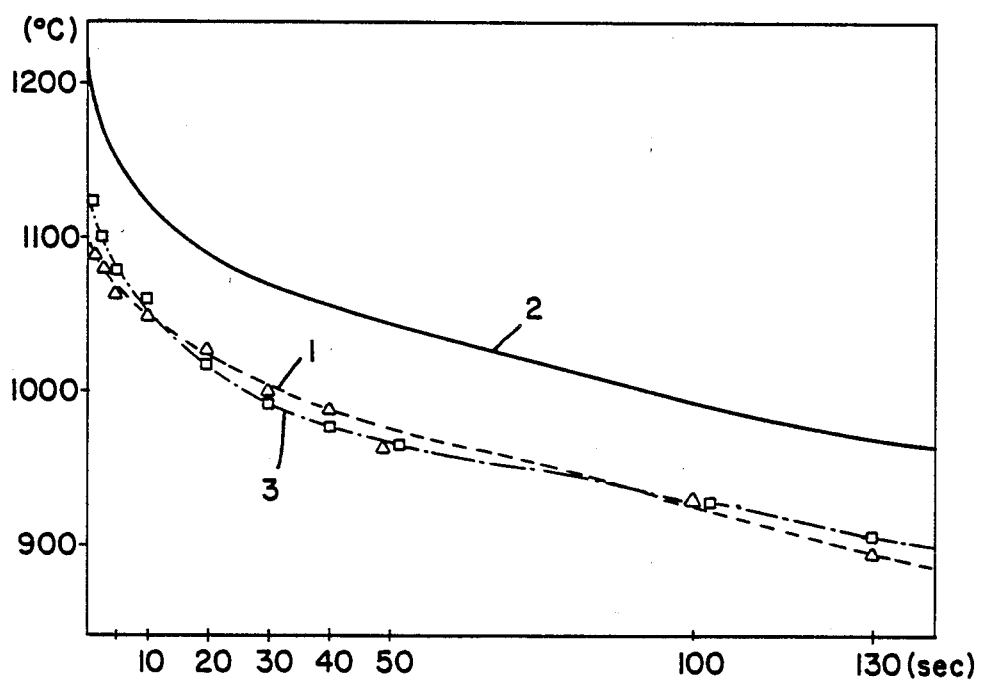
FIG. 2 illustrates the comparison between the cooling curve of a rotary graphite composite anode coated according to the invention and the cooling curves of pyrolytically coated and uncoated rotary graphite composite electrodes.

FIG. 2 illustrates the temperature-time curves recorded for of the three different rotary anodes during the operation of the tube. The cooling curve of the uncoated rotary anode is denoted by reference numeral 1, the cooling curve of the pyrolytically coated rotary anode by reference numeral 2, and the cooling curve of the rotary anode coated according to the invention by reference numeral 3. During cyclic tube operation, the rotary anodes were heated under the above-specified load conditions so that the maximum operating temperature of 1200° C. was not exceeded (pause time=190 seconds), and the cooling curves were measured with the aid of a spectral pyrometer. Based on these cooling curves, the radiation cooling of the anode coated according to the invention is substantially the same as with the uncoated graphite whereas the anode with pyrolytically coated graphite exhibits a distinctly lower cooling rate. As a result, the anode with pyrolytically coated graphite operates in the tube at distinctly higher temperatures.

The thermal emissivity was measured on the graphite anode manufactured according to the invention and with pyrolytic-coated and uncoated anodes at a radiation measuring Point. The coating was carried out under the same conditions as applied in the coating of the rotary anodes.

The following thermal emissivity values (E) were measured (T=1300° K.):

| | |
|---|---|
| Uncoated graphite | E = 0.78 |
| Graphite coated with pyrolytic carbon | E = 0.63 |
| Graphite coated with carbon according to the invention | E = 0.80 |

The rotary anodes were tested for their resistance to high voltage on the X-ray tube test stand. For testing the resistance to high voltage, the tube voltage was increased to 180 kV. Based on the frequency of flashovers occurring in the test, it was found that the rotary anode coated according to the invention and the one coated pyrolytically had a comparable resistance to high voltage that was significantly enhanced as compared to the uncoated rotary anode.

For the purpose of demonstrating the improved resistance to thermal shock of a rotary anode coated according to the invention, bending strips of graphite were pyrolytically coated with carbon and compared to anode coatings made in accordance with the present invention. The pyrolytically deposited carbon coatings, on the average, exhibited coat stresses three times as high as the carbon coatings deposited according to the invention. It was therefore concluded that carbon coatings of the present invention exhibit significantly enhanced resistance to thermal shock.

Figure 3:
FIG. 3 illustrates the break of a pyrolytically coated graphite part recorded by a grid electron micrograph picture at 6000-times enlargement.
Figure 4:
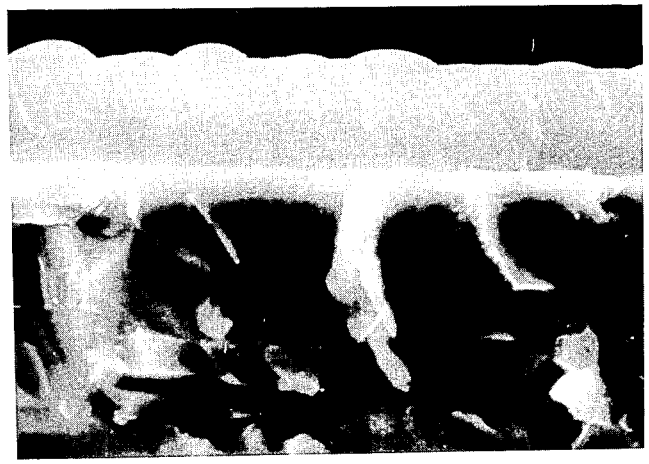
FIG. 4 illustrates the break of a graphite part coated according to the invention recorded by grid electron microscopic picture at 10,000-times enlargement.

FIG. 3 illustrates the lamella-like structure of a pyrolytically deposited carbon coating, which distinctly differs from the fine crystalline, break-amorphous structure of a carbon layer deposited according to the invention, as shown in FIG. 4.

What is claimed is:

1. A rotary graphite anode for use in X-ray tubes comprising:
   a basic body having a focal track coating of high melting metals on one of its surfaces and secured on another of its surfaces to a graphite substrate; said graphite substrate coated with a layer of carbon formed by decomposition of hydrocarbon gases in an activated d.c. voltage discharge.

2. The rotary graphite anode of claim 1, wherein the layer of carbon is formed by decomposition of hydrocarbon gases at temperatures ranging from about 200° C. to about 650° C.

3. The rotary graphite anode of claim 1, wherein said basic body is secured to said graphite substrate by soldering.

4. The rotary graphite anode of claim 3, wherein said basic body is comprised of a molybdenum metal alloy.

5. The rotary graphite anode of claims 1 or 2, wherein said focal track coating is an alloy selected from the group consisting of tungsten and tungsten-rhenium.

6. The rotary graphite anode of claims 1 or 2, wherein said hydrocarbon gases are selected from the group consisting of acetylene and propane.

7. The rotary graphite anode of claims 1 or 2, wherein said layer of carbon is formed both by electron beam evaporation of graphite and decomposition of hydrocarbon gases by activated d.c. voltage discharge.

8. The rotary graphite anode of claims 1 or 2, wherein said layer of carbon has a crystalline structure with grain sizes of less than about 0.1 μm and a (002) X-ray diffraction reflex with 2 H >0.6° half-value width.

9. The rotary graphite anode of claims 1 or 2, wherein said layer of carbon has a thickness of from about 3 μm to about 7 μm.

10. A method of manufacturing a rotary graphite anode for use in X-ray tubes comprising:
    (a) soldering a graphite substrate to a surface of a basic body comprised of a high melting alloy;
    (b) coating said graphite substrate with a layer of carbon formed both by decomposition of hydrocarbon gases at temperatures ranging from about 200° C. to about 650° C. and pressures ranging from about 0.5 Pa to about 2.0 Pa and evaporation of graphite by means of an electron beam gun, and
    (c) coating said basic body with a tungsten alloy coating.

11. The method of claim 10, wherein said high melting alloy is a molybdenum alloy.

12. The method of claim 10, wherein said tungsten alloy coating is comprised of a tungsten-rhenium alloy.

13. A rotary anode comprised of:
    a graphite substrate;
    a focal track coating secured to a first surface of said graphite substrate; and
    said graphite substrate coated on a second surface thereof with a layer of carbon formed by decomposition of hydrocarbon gases in an activated d.c. voltage discharge.

14. The rotary anode of claim 13 wherein said target layer is applied to said graphite substrate by chemical vapor deposition.

15. The rotary anode of claim 13 wherein the layer of carbon is formed by decomposition of hydrocarbon gases at temperatures ranging from about 200° C. to about 650° C.

16. The rotary anode of claim 13 wherein said focal track coating is comprised of a refractory metal or refractory metal alloy.

17. The rotary anode of claim 13 wherein said focal track coating is comprised of a tungsten-rhenium alloy.

18. The rotary anode of claim 13 wherein said hydrocarbon gases are selected from the group consisting of acetylene and propane.

19. The rotary anode of claim 13 wherein said layer of carbon is formed by electron beam evaporation of graphite and decomposition of hydrocarbon gases by activated d.c. voltage discharge.

20. The rotary anode of claim 13 wherein said layer of carbon has a crystalline structure with grain sizes of less than about 0.1 $\mu$m and a (002) x-ray diffraction reflex with $2\Theta > 0.6°$ half-value width.

21. The rotary graphite anode of claim 13 wherein said layer of carbon has a thickness of from about 3 $\mu$m to about 7 $\mu$m.

22. A method of manufacturing a rotary anode for use in x-ray tubes comprising:
  (a) applying a focal track coating comprised of a refractory metal or refractory metal alloy onto a graphite substrate; and
  (b) coating said graphite substrate with a layer of carbon formed both by decomposition of hydrocarbon gases at temperatures ranging from about 200° C. to about 650° C. and pressures ranging from about 0.5 Pa to about 2.0 Pa and evaporation of graphite by means of an electron beam gun.

23. The method of claim 22 wherein said focal track coating is applied by chemical vapor deposition.

* * * * *

UNITED STATES PATENT AND TRADEMARK OFFICE
CERTIFICATE OF CORRECTION

PATENT NO. : 4,901,338

DATED : February 13, 1990

INVENTOR(S) : Peter Rödhammer, et al.

It is certified that error appears in the above-identified patent and that said Letters Patent is hereby corrected as shown below:

Column 1, line 17, after "capacity insert --.--;

Column 1, line 20, "r.p.m" should be --r.p.m.--;

Column 1, line 32, after "temperatures", insert --.--;

Column 1, line 56, after "tube", insert --.--;

Column 1, line 57, "Particularly" should be --particularly--;

Column 1, line 65, after "anodes", insert --,--;

Column 2, line 44, "above-sated" should be --above-stated--;

Column 2, line 50, text should continue on line after "gas";

Column 3, line 10, "H > 0.6°" should be -- $\widehat{H}$ > 0.6° --;

Column 3, line 47, after "market", insert --,--;

Column 4, line 19 "Plating-coating" should be --plating-coating--;

Column 4, line 42, "80" should be --80%--;

Column 4, line 48, "cm$^2$," should be --cm2--;

Column 5, line 12, delete "of";

Column 5, line 26, after "graphite", insert --,--;

Column 5, line 34, "Point" should be --point--;

UNITED STATES PATENT AND TRADEMARK OFFICE
CERTIFICATE OF CORRECTION

PATENT NO. : 4,901,338
DATED : February 13, 1990
INVENTOR(S) : Peter Rödhammer, et al.

It is certified that error appears in the above-identified patent and that said Letters Patent is hereby corrected as shown below:

Column 6, line 34, "H" should be -- (H) --;

Column 6, line 47, "," should be --;--;

Column 7, line 17, "H" should be -- (H) --;

Column 8, line 2, "3 = m" should be --3 $\mu$m--;

Signed and Sealed this

Sixth Day of April, 1993

Attest:

STEPHEN G. KUNIN

*Attesting Officer*    Acting Commissioner of Patents and Trademarks